(12) United States Patent
Wang et al.

(10) Patent No.: US 11,854,842 B2
(45) Date of Patent: Dec. 26, 2023

(54) SUBSTRATE HEAT TREATMENT APPARATUS

(71) Applicant: ACM Research (Shanghai) Inc., Shanghai (CN)

(72) Inventors: Hui Wang, Shanghai (CN); Hongchao Yang, Shanghai (CN); Jun Wu, Shanghai (CN); Wenjun Wang, Shanghai (CN); Fuping Chen, Shanghai (CN); Zhiyou Fang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 1400 days.

(21) Appl. No.: 16/086,227

(22) PCT Filed: Mar. 18, 2016

(86) PCT No.: PCT/CN2016/076681
§ 371 (c)(1),
(2) Date: Sep. 18, 2018

(87) PCT Pub. No.: WO2017/156758
PCT Pub. Date: Sep. 21, 2017

(65) Prior Publication Data
US 2020/0294825 A1    Sep. 17, 2020

(51) Int. Cl.
*H01L 21/67* (2006.01)
*F27B 17/00* (2006.01)
(Continued)

(52) U.S. Cl.
CPC .... *H01L 21/67109* (2013.01); *F27B 17/0025* (2013.01); *F27D 5/0037* (2013.01);
(Continued)

(58) Field of Classification Search
CPC ......... H01L 21/67109; H01L 21/67248; H01L 21/68742; F27B 17/0025; F27D 5/0037
(Continued)

(56) References Cited

U.S. PATENT DOCUMENTS 7,417,206 B2 *  8/2008  Nakamura ........ H01L 21/67103
                                                       219/444.1
7,432,476 B2 * 10/2008  Morita .............. H01L 21/68742
                                                       219/444.1
(Continued)

FOREIGN PATENT DOCUMENTS

CN        105097612 A      11/2015
CN        105280518 A       1/2016
(Continued)

OTHER PUBLICATIONS

KR 20060122569 A USPTO machine translation (Year: 2022).*
(Continued)

*Primary Examiner* — Michael G Hoang
*Assistant Examiner* — Kurt J Wolford
(74) *Attorney, Agent, or Firm* — Osha Bergman Watanabe & Burton LLP (57) ABSTRACT

The present invention provides a substrate heat treatment apparatus for heat treating a substrate, including a bake plate, support components, a baffle plate, and a driving device. The bake plate defines at least one gas passage. The support components support the substrate. The baffle plate is fixed on a top surface of the bake plate. The baffle plate surrounds the substrate and a gap is formed between an inner circumferential wall of the baffle plate and the substrate. A driving device drives the plurality of support components to move up or down. When heat treating the substrate, a hot gas is supplied to the space between the substrate and the top surface of the bake plate through the gas passage of the bake
(Continued)

plate, and the hot gas flows out through the gap formed between the inner circumferential wall of the baffle plate and the substrate.

18 Claims, 13 Drawing Sheets

(51) Int. Cl.
*F27D 5/00* (2006.01)
*H01L 21/687* (2006.01)

(52) U.S. Cl.
CPC .. *H01L 21/67248* (2013.01); *H01L 21/68742* (2013.01); *H01L 21/68735* (2013.01); *H01L 21/68785* (2013.01)

(58) Field of Classification Search
USPC ....................................................... 219/444.1
See application file for complete search history.

(56) References Cited

U.S. PATENT DOCUMENTS

| | | | | |
|---|---|---|---|---|
| 7,467,901 | B2* | 12/2008 | Kamei | H01L 21/67109 |
| | | | | 219/444.1 |
| 7,927,096 | B2* | 4/2011 | Fukumoto | H01L 21/68742 |
| | | | | 219/444.1 |
| 8,519,309 | B2* | 8/2013 | Iwata | H01L 21/67109 |
| | | | | 219/444.1 |
| 8,608,885 | B2* | 12/2013 | Goto | F27D 5/0037 |
| | | | | 219/444.1 |
| 2004/0261721 | A1* | 12/2004 | Steger | H01L 21/67109 |
| | | | | 118/728 |
| 2012/0219713 | A1 | 8/2012 | Sferlazzo et al. | |

FOREIGN PATENT DOCUMENTS

| | | | | |
|---|---|---|---|---|
| JP | S63-067239 | U | | 5/1988 |
| JP | H1055951 | A * | 2/1998 | ........... H01L 21/027 |
| JP | 2001-44117 | A | | 2/2001 |
| JP | 2001-176764 | A | | 6/2001 |
| JP | 2001-237155 | A | | 8/2001 |
| JP | 2004-247345 | A | | 9/2004 |
| KR | 20060122569 | A * | 11/2006 | ....... H01L 21/67248 |
| WO | WO-2004114379 | A1 * | 12/2004 | ....... H01L 21/67109 |

OTHER PUBLICATIONS

WO-2004114379-A1 USPTO machine translation (Year: 2022).*
JP-H1055951-A USPTO machine translation (Year: 2022).*
Office Action issued in corresponding KR Application No. 10-2018-7028737 with English translation dated Jun. 2, 2022 (11 pages).
International Search Report issued in PCT/CN2016/076681 dated Dec. 20, 2016 (2 pages).
Written Opinion of the International Searching Authority issued in PCT/CN2016/076681 dated Dec. 20, 2016 (3 pages).
Office Action issued in the counterpart Taiwanese Patent Application No. 10920626720, dated Jul. 7, 2020 (5 pages).
Office Action issued in corresponding Japanese Application No. 2018-547996 dated Nov. 26, 2019, and English translation thereof (9 pages).
Office Action issued in corresponding CN Application No. 201680083753.0 with English translation dated Jul. 2, 2021, (17 pages).

* cited by examiner

SUBSTRATE HEAT TREATMENT APPARATUS

FIELD OF THE INVENTION

The present invention generally relates to a field of semiconductor devices manufacture, and more particularly relates to a substrate heat treatment apparatus for heat treating a substrate.

BACKGROUND

Figure 12A:
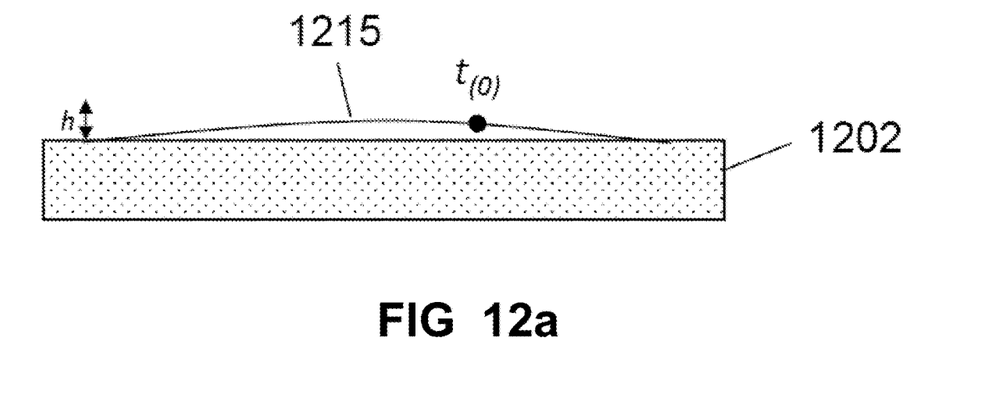
Figure 12B:
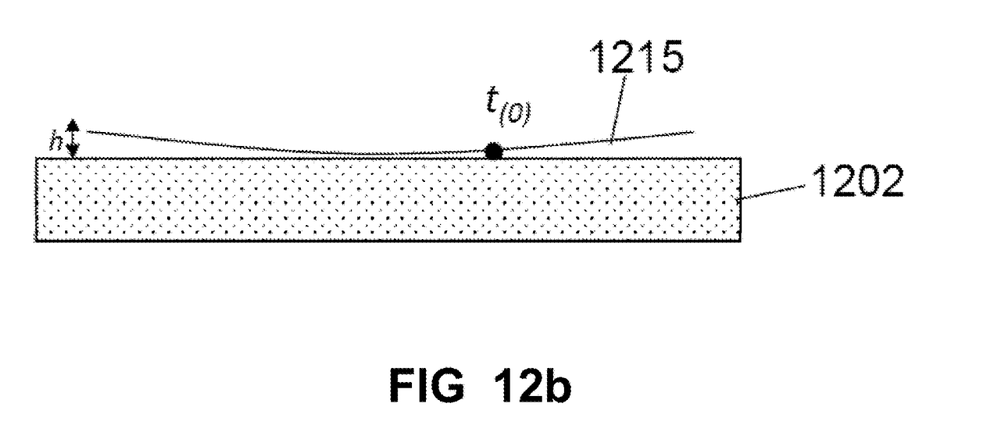
Figure 12C:
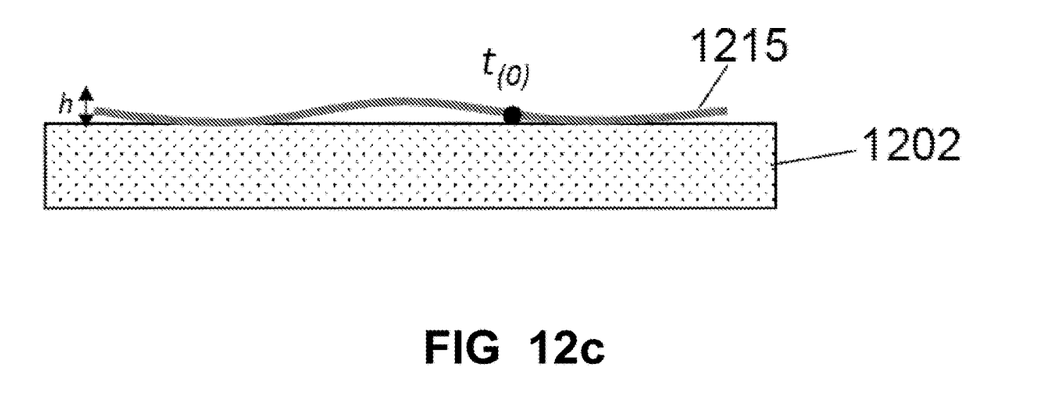
Figure 13:
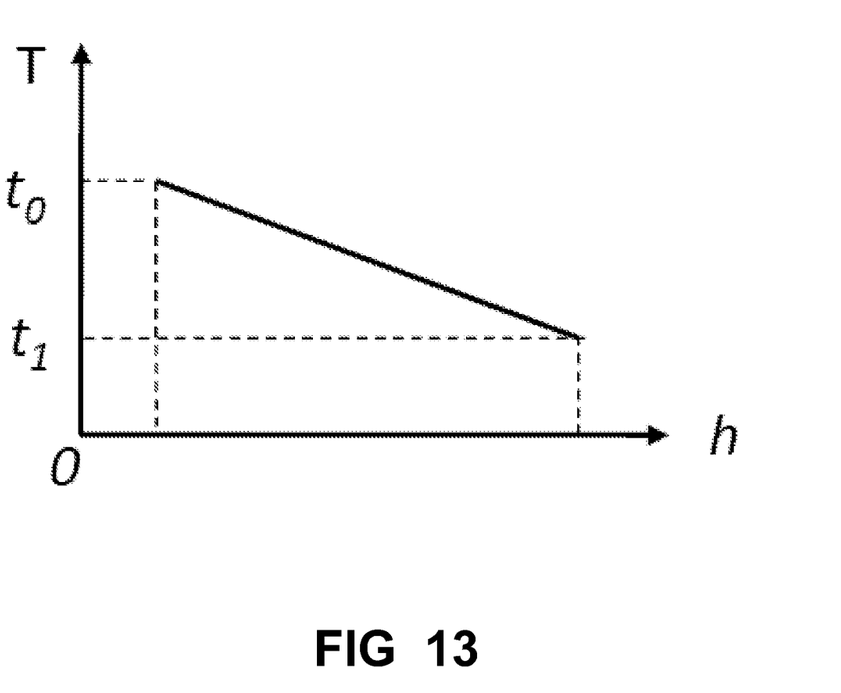
FIG. 13 shows the relationship between the heated temperature t(h) of any point of the substrate and the distance (h) between the any point of the substrate and a bake plate when using the conventional substrate heat treatment apparatus to heat treat the substrate.

A photolithography process is an essential part of semiconductor devices manufacture. In the photolithography process, various heat treatments are performed, such as a soft bake after spin coating photoresist on a substrate, a post-exposure bake, and a hard bake after developing. When heat treating the substrate for manufacturing the semiconductor devices, with the improvement of precision of the semiconductor devices, a high degree of temperature uniformity is required during the heat treating process. In a conventional substrate heat treatment apparatus, the substrate is generally placed on a bake plate to heat directly. Although this way of placing the substrate on the bake plate to heat directly is simple, it is hard to guarantee that the substrate is heated evenly because of the warpage of the substrate. Even the substrate looks very flat, but actually, the substrate may still have a certain degree of warpage. Especially, if the substrate is an ultra thin substrate, the warpage of the substrate may be more obviously. As shown in FIG. 12a to FIG. 12c, a substrate 1215 may be upward convex, downward concave, or both. No matter what form of the warpage the substrate 1215 has, if the substrate 1215 is placed on a bake plate 1202 to heat directly, because the distance (h) between any point of the substrate 1215 and the bake plate 1202 is different, and a temperature gradient exists in the space above the bake plate 1202, therefore, the substrate 1215 is heated unevenly during the heat treating process. The temperature of the substrate 1215 is non-uniform after heat treatment, which brings an adverse effect on the quality of the semiconductor devices or even makes the substrate 1215 scrap. FIG. 13 shows the relationship between the heated temperature t(h) of any point of the substrate 1215 and the distance (h) between the any point of the substrate 1215 and the bake plate 1202. It can be seen that the heated temperature t(h) decreases with the increase of the distance (h). Moreover, before the substrate 1215 is heat treated, the substrate 1215 may undergo such as coating, developing processes. When the substrate 1215 is placed on the bake plate 1202 to heat, organic solvent, such as hot photoresist on the substrate 1215 easily flows back and dirties the bake plate 1202.

SUMMARY

The present invention provides a substrate heat treatment apparatus for heat treating a substrate, comprising a bake plate, a plurality of support components, a baffle plate, and a driving device. The bake plate defines at least one gas passage. The plurality of support components support the substrate. The baffle plate is fixed on a top surface of the bake plate. The baffle plate surrounds the substrate and a gap is formed between an inner circumferential wall of the baffle plate and the substrate. A driving device drives the plurality of support components to move up or down. When heat treating the substrate, a hot gas is supplied to the space between the substrate and the top surface of the bake plate through the gas passage of the bake plate, and the hot gas flows out through the gap formed between the inner circumferential wall of the baffle plate and the substrate.

As described above, the advantage of the substrate heat treatment apparatus of the present invention at least includes three aspects. Firstly, no matter whether the substrate is warped or not, through supplying the hot gas to the space between the substrate and the top surface of the bake plate to increase the gas convection and form the isothermal layer between the substrate and the top surface of the bake plate, the substrate is heated evenly. Secondly, because of the baffle plate, the substrate center aligns with the bake plate, and for the gap formed between the inner circumferential wall of the baffle plate and the substrate is small enough, the flow of the hot gas around the substrate flowing out from the gap is uniform no matter whether the substrate is warped or not for forming the isothermal layer between the substrate and the top surface of the bake plate. Thirdly, because the gap formed between the inner circumferential wall of the baffle plate and the substrate is small and the hot gas is continuously supplied to the space between the substrate and the top surface of the bake plate during the heat treating process, and mixed gas of the hot gas and organic solvent is exhausted continuously, the organic solvent on the substrate is hard to flow back to the support components and the bake plate, avoiding frequently cleaning the support components.

BRIEF DESCRIPTION OF THE DRAWINGS

FIG. 10a to FIG. 10c show using the substrate heat treatment apparatus of the present invention to heat treat a substrate which is upward convex, downward concave or both.

FIG. 12a to FIG. 12c show using a conventional substrate heat treatment apparatus to heat treat a substrate which is upward convex, downward concave or both.

DETAILED DESCRIPTION

Figure 1:
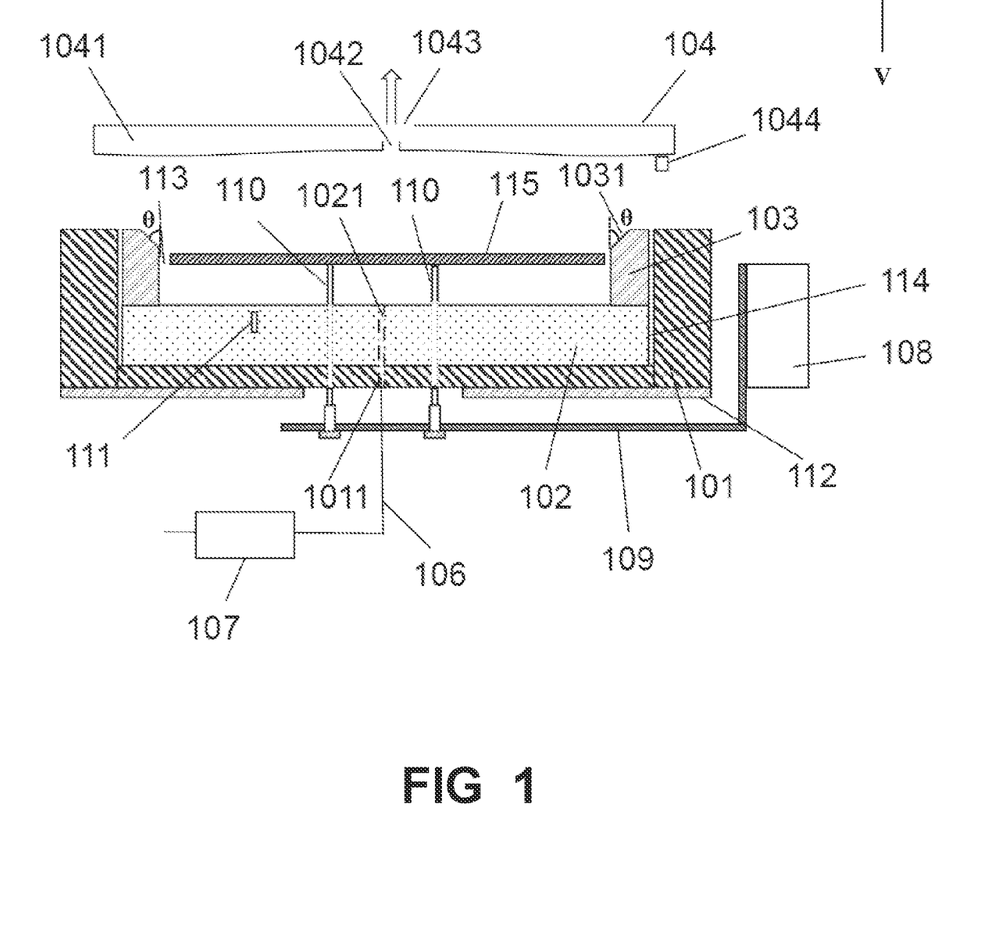
FIG. 1 is a cross sectional view showing a substrate heat treatment apparatus for heat treating a substrate according to an exemplary embodiment of the present invention.

Referring to FIG. 1, a substrate heat treatment apparatus for heat treating a substrate according to an exemplary embodiment of the present invention is illustrated. The substrate heat treatment apparatus has a heat insulation holder 101, a bake plate 102, a baffle plate 103, a lift cover 104, and a plurality of support components 110. The bake plate 102 is disposed in the heat insulation holder 101 for heating a substrate 115. The bake plate 102 can be a circular electric heating panel which is made of aluminum. During the heat treating process, the temperature distribution on a top surface of the bake plate 102 is very uniform. The size of the bake plate 102 is determined by the size of the substrate 115 in order to heat treat the substrate 115 with different size. For example, in view that the size of the substrate 115 which is commonly used now is 8 inch or 12 inch, the diameter of the bake plate 102 can be 350 mm. Therefore, the bake plate 102 can heat treat the substrate 115 which size is 8 inch or 12 inch.

The bake plate 102 is received in the heat insulation holder 101 and the center of the bake plate 102 is aligned with the center of the heat insulation holder 101. An interval 114 is formed between a side wall of the bake plate 102 and the heat insulation holder 101 for avoiding the temperature characteristic of the side wall of the bake plate 102 being affected and the heat insulation holder 101 being squeezed by the bake plate 102 when the bake plate 102 expands by heat. The heat insulation holder 101 is made of high-temperature-resistant material, such as ceramic. The center of the heat insulation holder 101 defines a first gas passage 1011. The first gas passage 1011 passes through the heat insulation holder 101. The center of the bake plate 102 defines a second gas passage 1021. The second gas passage 1021 passes through the bake plate 102 and communicates with the first gas passage 1011. One end of the first gas passage 1011 communicates with the second gas passage 1021 and the other end of the first gas passage 1011 connects to a gas line 106 which is wrapped by a thermal insulation material. A gas heater 107 is disposed on the gas line 106 for heating the gas in the gas line 106, so that a hot gas is supplied to the space between the substrate 115 and the top surface of the bake plate 102 through the first gas passage 1011 and the second gas passage 1021. The substrate 115 is supported above the top surface of the bake plate 102 by the plurality of support components 110 which respectively pass through the heat insulation holder 101 and the bake plate 102. The plurality of support components 110 are fixed on a support arm 109. The support arm 109 connects to a driving device 108. The driving device 108 drives the support arm 109 to move up or down, which brings the plurality of support components 110 to move up or down, which further brings the substrate 115 to move up or down for adjusting the distance between the substrate 115 and the top surface of the bake plate 102 or for loading or unloading the substrate 115. The driving device 108 can be a motor.

Figure 9A:
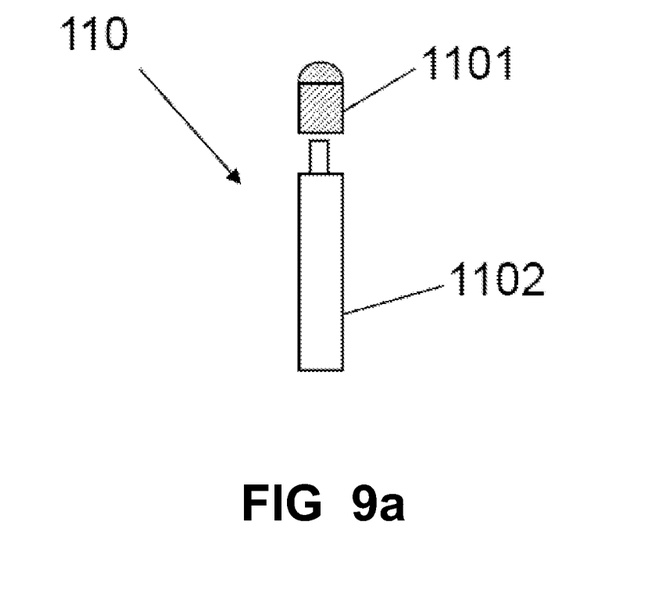
FIG. 9a is an exploded view of a support component of the substrate heat treatment apparatus of the present invention.
Figure 9B:
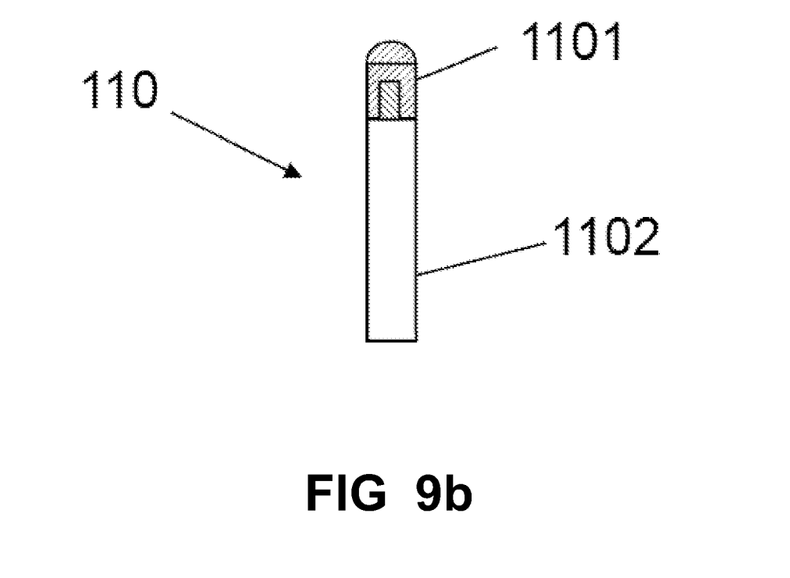
FIG. 9b is a perspective view of the support component of the substrate heat treatment apparatus of the present invention.
Figure 10A:
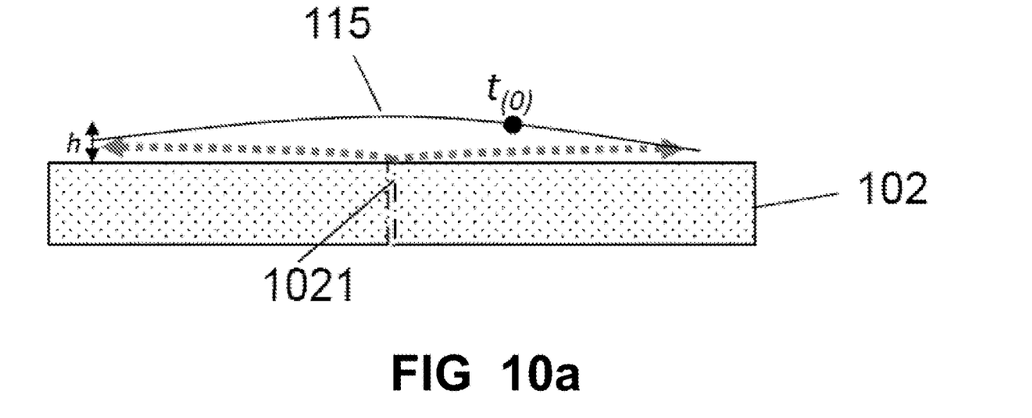
Figure 10B:
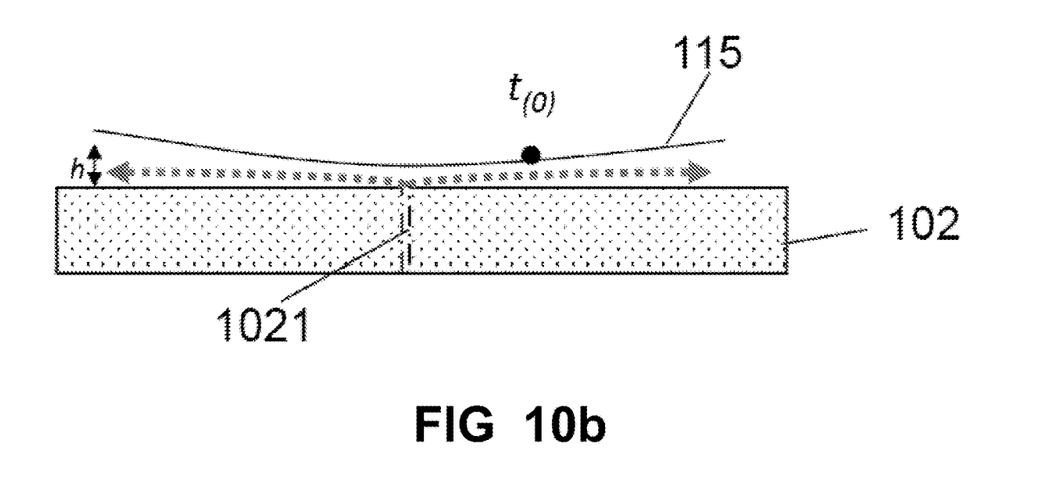
Figure 10C:
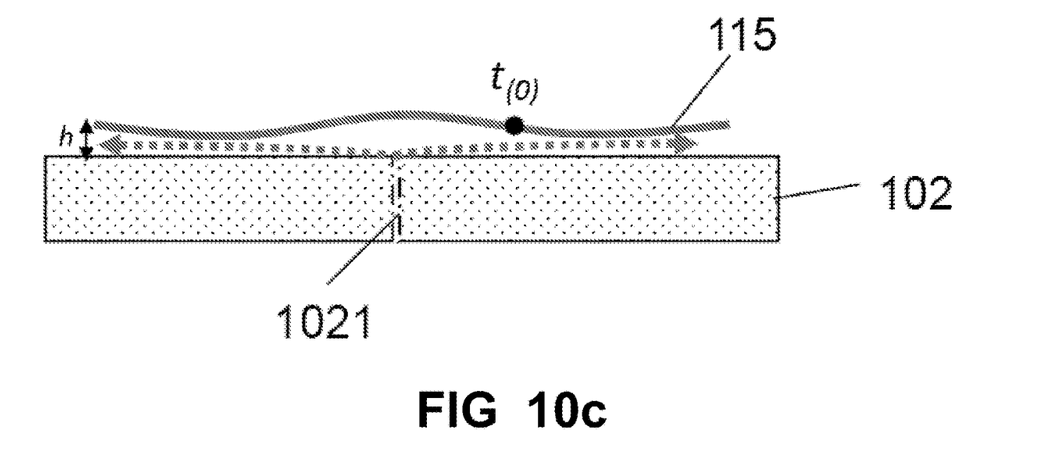
Figure 11:
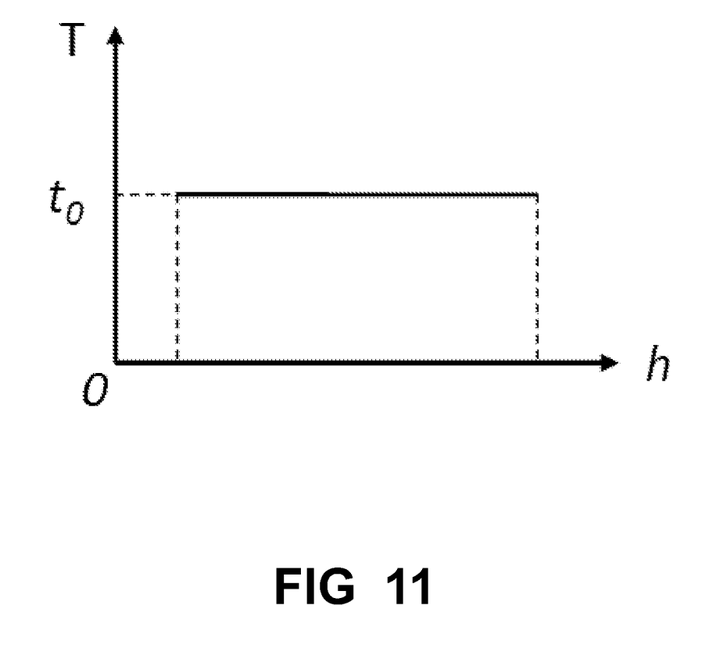
FIG. 11 shows the relationship between the heated temperature t(h) of any point of the substrate and the distance (h) between the any point of the substrate and a bake plate when using the substrate heat treatment apparatus of the present invention to heat treat the substrate.

As shown in FIGS. 9a and 9b, in an embodiment, the support component 110 has an anti-slip pin 1101 and a support shaft 1102. The anti-slip pin 1101 has a ball-shaped head for supporting the substrate 115. The anti-slip pin 1101 is mounted on a top end of the support shaft 1102 by a way of, such as thread locking, so that it is easy to disassemble and replace the anti-slip pin 1101. Because the anti-slip pin 1101 has an anti-slip function, therefore, the anti-slip pin 1101 prevents the substrate 115 from horizontally moving when the substrate 115 is placed on the anti-slip pin 1101 and moves up or down. A bottom end of the support shaft 1102 is fixed on the support arm 109.

The baffle plate 103 is fixed on the top surface of the bake plate 102, and the baffle plate 103 can be dismountable. The baffle plate 103 surrounds the substrate 115 and a gap 113 is formed between an inner circumferential wall of the baffle plate 103 and the substrate 115. The gap 113 is in the range of 0.1 mm-1 mm, and preferably 0.1 mm-0.5 mm. The baffle plate 103 has a guide plane 1031 for conveniently loading the substrate 115 on the support components 110. The guide plane 1031 is tilted and has an angle θ with the vertical plane V. The angle θ is less than 20 degrees, and preferably is 15 degrees. The material of the baffle plate 103 can be ceramic or stainless steel wrapped by a thermal insulation material.

The lift cover 104 is disposed above the baffle plate 103. The lift cover 104 has a hollow cavity 1041. The lift cover 104 defines an inlet port 1042 and an exhaust interface 1043. The inlet port 1042 and the exhaust interface 1043 communicate with the hollow cavity 1041 and the exhaust interface 1043 connects to an exhaust system. Through the inlet port 1042 and the exhaust interface 1043, mixed gas generated during the heat treating process can be exhausted. The lift cover 104 also defines a drain port 1044 communicating with the hollow cavity 1041.

A temperature sensor 111 is disposed in the bake plate 102 for monitoring the temperature of the bake plate 102. The temperature sensor 111 can be a thermocouple. The heat insulation holder 101 is disposed on a pedestal 112.

Figure 2:
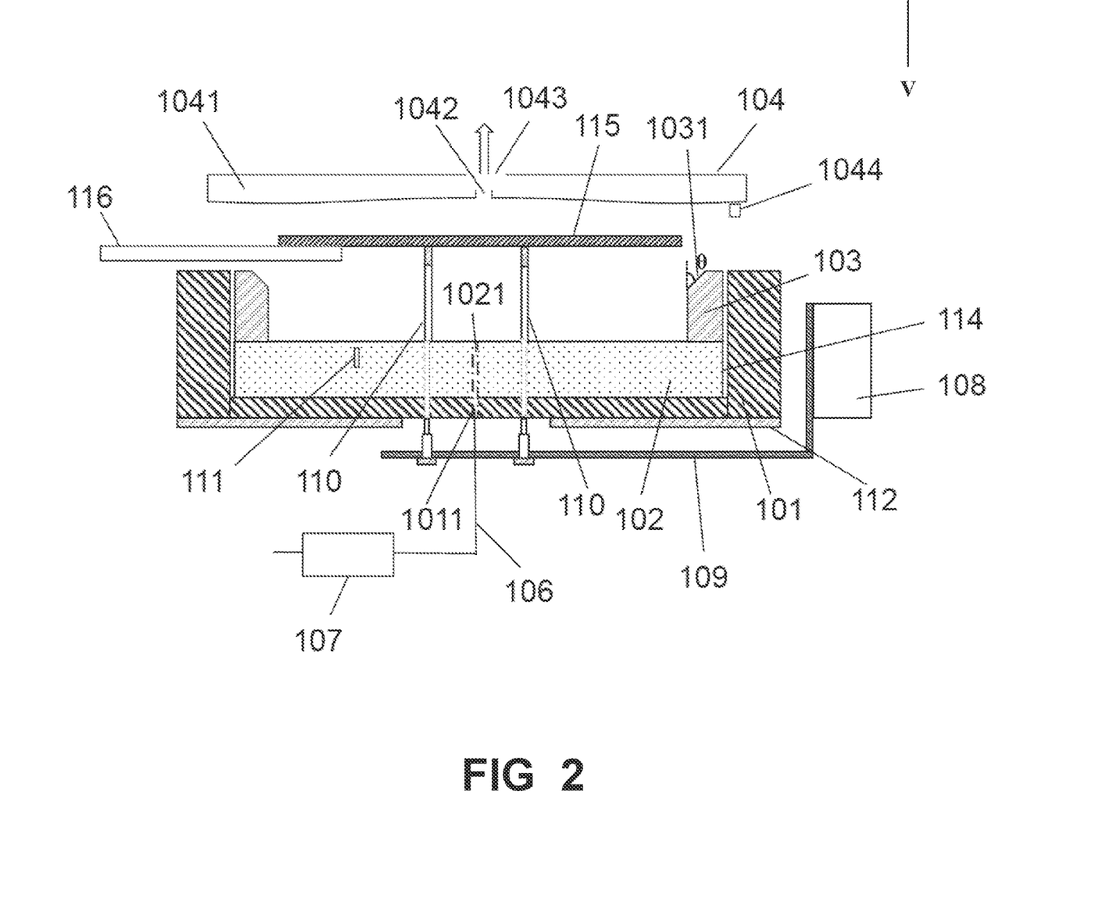
FIG. 2 is a cross sectional view showing the substrate heat treatment apparatus loading or unloading the substrate.

When using the substrate heat treatment apparatus of the present invention to heat treat the substrate 115 which has undergone, for example, spin coating photoresist, as shown in FIG. 2, the driving device 108 drives the support arm 109 to move up to make the plurality of support components 110 arrive at a loading position. Then the substrate 115 is placed on the plurality of support components 110 by using, such as a robot arm 116. The driving device 108 drives the support arm 109 to move down to make the substrate 115 arrive at a process position. There is a distance between the substrate 115 and the top surface of the bake plate 102. So the substrate 115 doesn't contact the top surface of the bake plate 102. The size of the distance is determined by the process requirement. Hot inert gas or hot nitrogen, is supplied to the space between the substrate 115 and the top surface of the bake plate 102 through the first gas passage 1011 and the second gas passage 1021. Taking the hot inert gas for example, the temperature of the hot inert gas can be the same as the temperature of the bake plate 102, or close to the temperature of the bake plate 102. Through supplying the hot inert gas to the space between the substrate 115 and the top surface of the bake plate 102, the gas convection is increased and an isothermal layer is formed between the substrate 115 and the top surface of the bake plate 102, which makes the rate of heat conduction be same and destroys the temperature gradient in the space above the top surface of the bake plate 602, therefore, the substrate 115 is heated evenly during the heat treating process no matter whether the substrate 115 is warped or not. The mixed gas generated during the heat treating process is exhausted into the hollow cavity 1041 through the inlet port 1042 and the mixed gas in the hollow cavity 1041 is exhausted out through the exhaust interface 1043. Before the substrate 115 is heat treated, the substrate 115 may undergo such as coating, developing processes. When the substrate 115 is heat treated, organic solvent, such as photoresist on the substrate 115 is volatilized and exhausted into the hollow cavity 1041 along with the hot inert gas. The organic solvent is condensed in the hollow cavity 1041 and is drained out from the drain port 1044. Because the gap 113 formed between the inner circumferential wall of the baffle plate 103 and the substrate 115 is small enough and the hot inert gas is continuously supplied to the space between the substrate 115 and the top surface of the bake plate 102 during the heat treating process, the organic solvent on the substrate 115 is hard to flow back to the support components 110 and the bake plate 102. Moreover, the substrate heat treatment apparatus of the present invention has the baffle plate 103 fixed on the top surface of the bake plate 102, when the substrate 115 is heat treated by using the substrate heat treatment apparatus of the present invention, the substrate 115 is easy to center align with the bake plate 102. When the robot arm 116 loads or unloads the substrate 115, there is no need to center align any more. Besides, for the gap 113 formed between the inner circumferential wall of the baffle plate 103 and the substrate 115 is small enough, the flow of the hot inert gas around the substrate 115 flowing out from the gap 113 is uniform no matter whether the substrate 115 is warped or not for forming the isothermal layer between the substrate 115 and the top surface of the bake plate 102. After the substrate 115 is heat treated, the driving device 108 drives the support arm 109 to move up to make the plurality of support components 110 arrive at an unloading position. The robot arm 116 takes away the substrate 115 from the support components 110 and the hot inert gas is stopped to supply.

As shown in FIGS. 10a to 10c and FIG. 11, even if the substrate 115 is upward convex, downward concave or both, because of supplying the hot inert gas to the space between the substrate 115 and the top surface of the bake plate 102 to increase the gas convection and form the isothermal layer between the substrate 115 and the top surface of the bake plate 102, although the distance (h) between any point of the substrate 115 and the bake plate 102 is different, the substrate 115 is heated evenly and the temperature of the substrate 115 is uniform after heat treatment.

Figure 3:
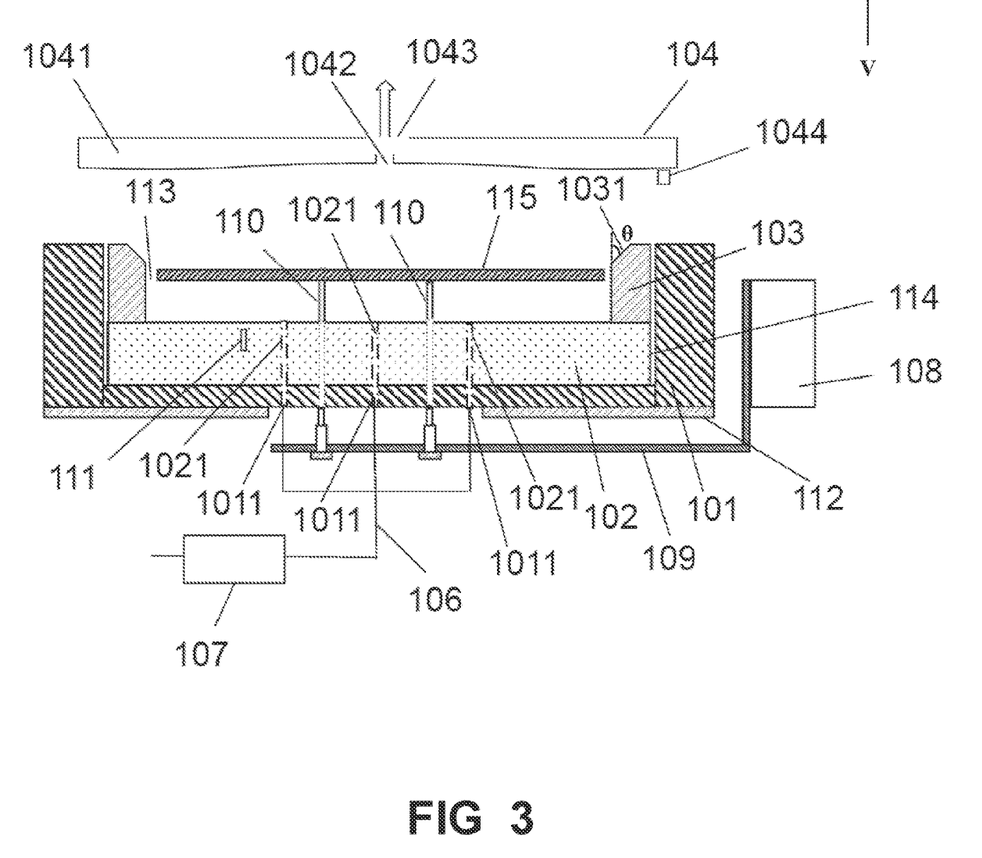
FIG. 3 is a cross sectional view showing a substrate heat treatment apparatus for heat treating a substrate according to another exemplary embodiment of the present invention.

As shown in FIG. 3, in another embodiment, the heat insulation holder 101 and the bake plate 102 respectively define a plurality of first gas passages 1011 and a plurality of second gas passages 1021 for supplying the hot gas to the space between the substrate 115 and the top surface of the bake plate 102. The plurality of first gas passages 1011 respectively connect to the gas line 106.

Figure 4:
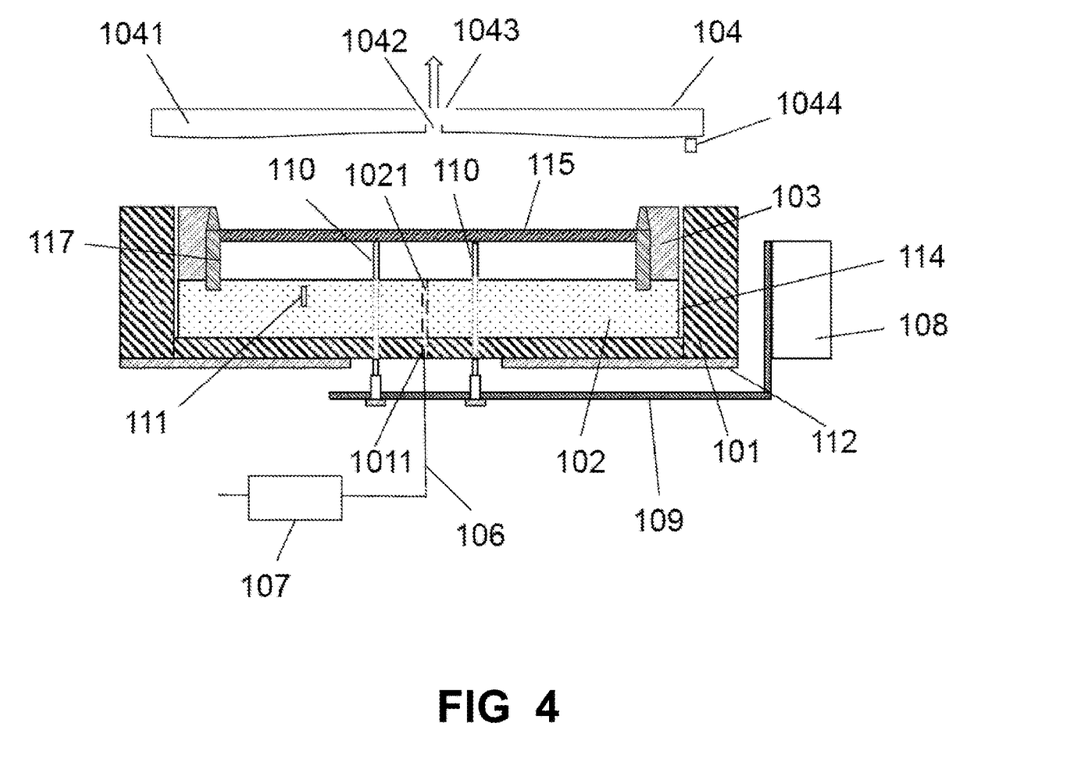
FIG. 4 is a cross sectional view showing a substrate heat treatment apparatus for heat treating a substrate according to another exemplary embodiment of the present invention.
Figure 5:
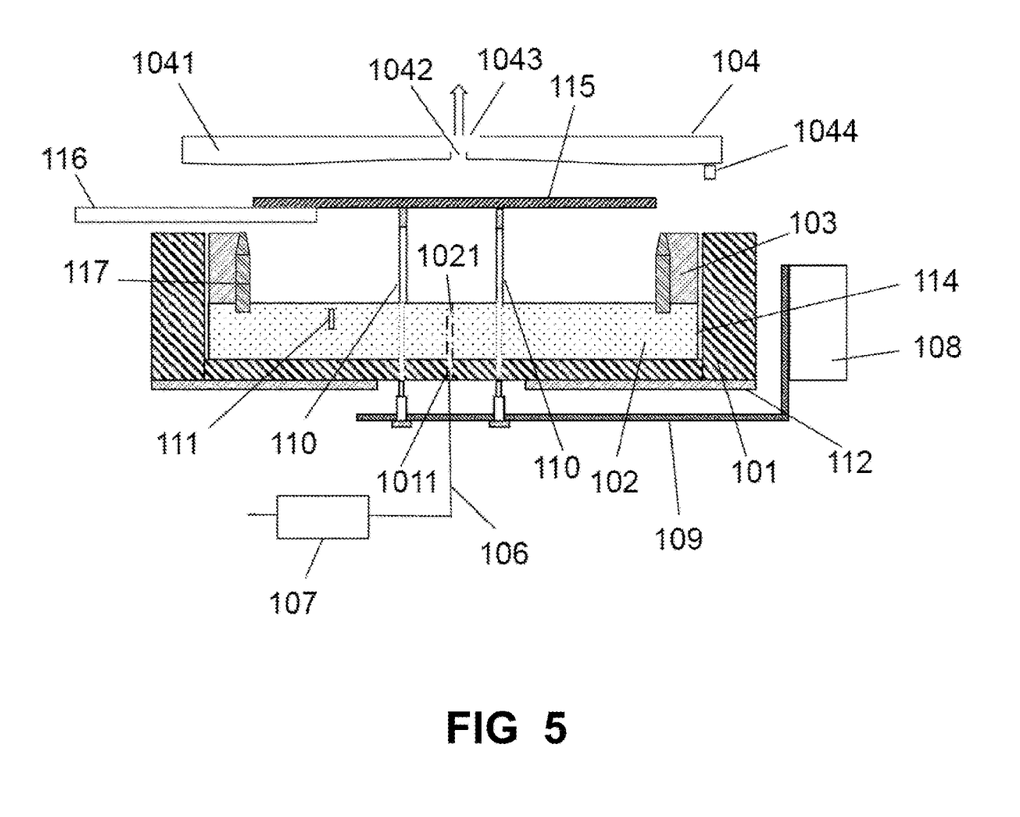
FIG. 5 is a cross sectional view showing the substrate heat treatment apparatus loading or unloading the substrate.
Figure 7:
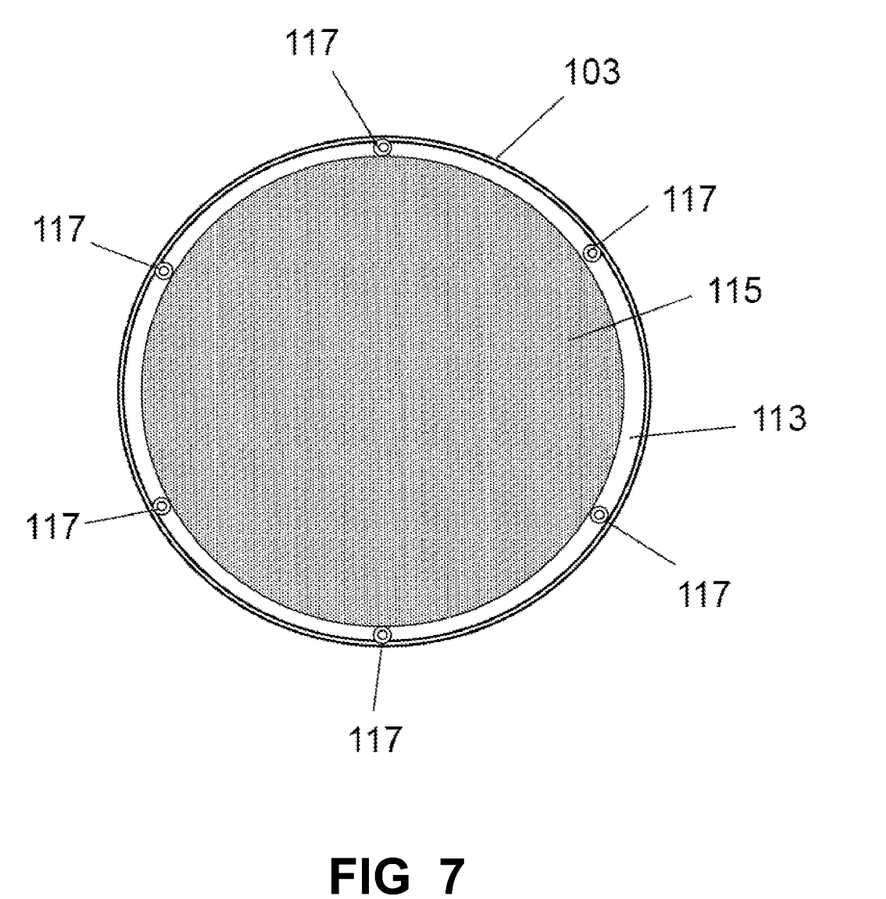
FIG. 7 is a top view showing a baffle plate combining with a plurality of position-restricted pins for a substrate center alignment and a gap formed between an inner circumferential wall of the baffle plate and the substrate.
Figure 8:
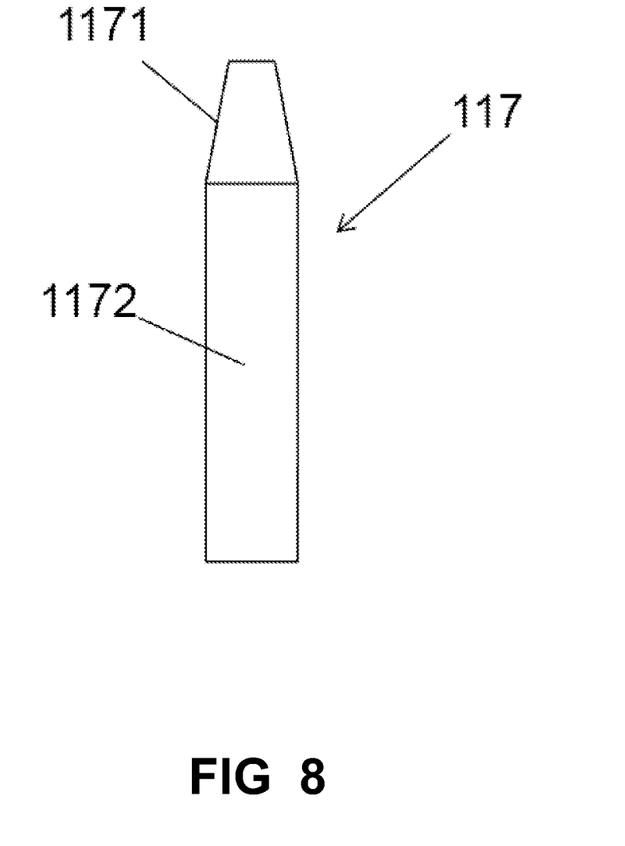
FIG. 8 is a side view showing the position-restricted pin.

As shown in FIG. 4 and FIG. 5, in another embodiment, for avoiding the substrate 115 misaligning to induce the substrate 115 to contact the baffle plate 103, a plurality of position-restricted pins 117 are vertically inserted in the baffle plate 103 and the bake plate 102. The plurality of position-restricted pins 117 are uniformly distributed along the inner circumferential wall of the baffle plate 103. As shown in FIG. 8, every position-restricted pin 117 has a guiding section 1171 and a restricting section 1172. As shown in FIG. 7, when the substrate 115 is placed on the support components 110 and moves down to the process position along the guiding sections 1171, the substrate 115 is restricted by the restricting sections 1172, so that the substrate 115 can center align with the bake plate 102 and the gap 113 is formed between the inner circumferential wall of the baffle plate 103 and the substrate 115.

Figure 6:
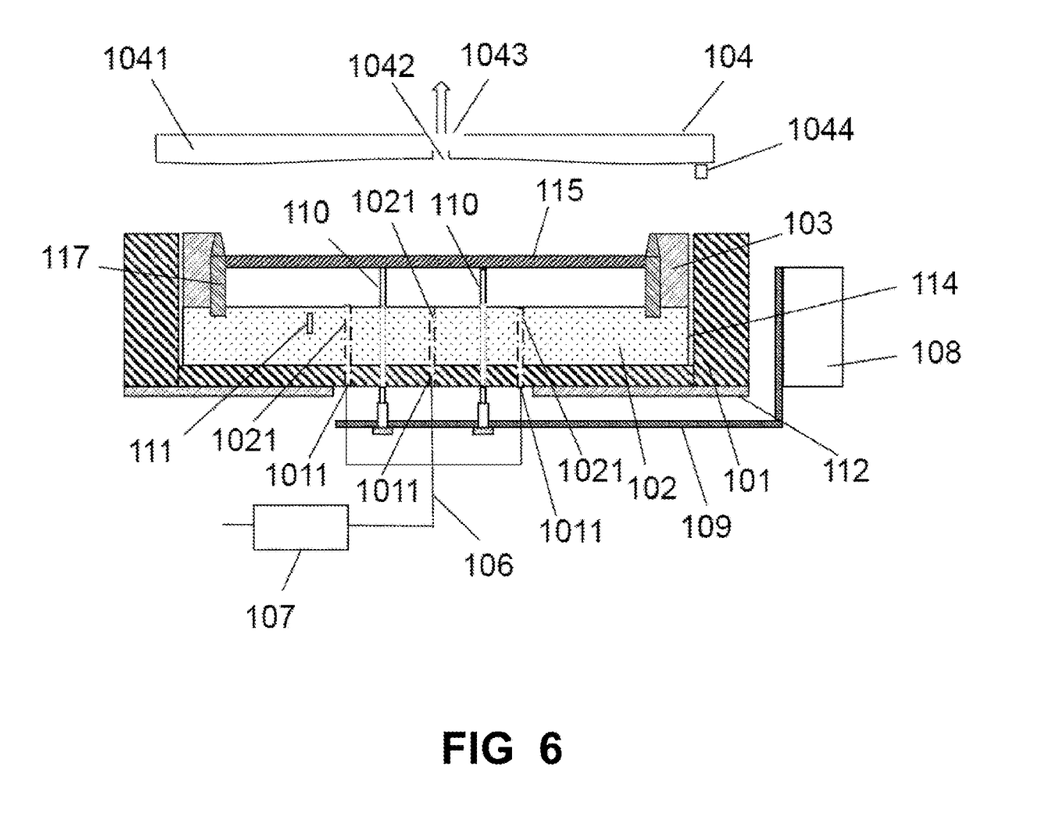
FIG. 6 is a cross sectional view showing a substrate heat treatment apparatus for heat treating a substrate according to another exemplary embodiment of the present invention.

As shown in FIG. 6, comparing to the embodiment disclosed in FIG. 4 and FIG. 5, the heat insulation holder 101 and the bake plate 102 in another embodiment disclosed in FIG. 6 respectively define a plurality of first gas passages 1011 and a plurality of second gas passages 1021 for supplying the hot gas to the space between the substrate 115 and the top surface of the bake plate 102. The plurality of first gas passages 1011 respectively connect to the gas line 106.

As described above, the advantage of the substrate heat treatment apparatus of the present invention at least includes three aspects. Firstly, no matter whether the substrate 115 is warpping or not, through supplying hot gas to the space between the substrate 115 and the top surface of the bake plate 102 to increase the gas convection and form the isothermal layer between the substrate 115 and the top surface of the bake plate 102, the substrate 115 is heated evenly. Secondly, because of the baffle plate 103 and the position-restricted pins 117, the substrate 115 automatically center aligns with the bake plate 102. Besides, for the gap 113 formed between the inner circumferential wall of the baffle plate 103 and the substrate 115 is small enough, the flow of the hot gas around the substrate 115 flowing out from the gap 113 is uniform no matter whether the substrate 115 is warped or not for forming the isothermal layer between the substrate 115 and the top surface of the bake plate 102. Thirdly, because the gap 113 formed between the inner circumferential wall of the baffle plate 103 and the substrate 115 is small and the hot gas is continuously supplied to the space between the substrate 115 and the top surface of the bake plate 102 during the heat treating process, and mixed gas of the hot gas and organic solvent is exhausted continuously, the organic solvent on the substrate 115 is hard to flow back to the support components 110 and the bake plate 102, avoiding frequently cleaning the support components 110.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A substrate heat treatment apparatus for heat treating a substrate, comprising:
   a bake plate for defining at least one gas passage;
   a plurality of support components for supporting the substrate;
   a baffle plate fixed on a top surface of the bake plate, the baffle plate surrounding the substrate and an existing gap formed between an inner circumferential wall of the baffle plate and the substrate; and
   a driving device for driving the plurality of support components to move up or move down;
   a gas heater disposed on a gas line for heating the gas in the gas line;
   wherein when heat treating the substrate, the gas heater directly heats the gas supplied to a space between the substrate and the top surface of the bake plate through the at least one gas passage of the bake plate, and the heated gas flows out through the existing gap formed between the inner circumferential wall of the baffle plate and the substrate.

2. The apparatus according to claim 1, further comprising a plurality of position-restricted pins vertically inserted in the baffle plate and the bake plate.

3. The apparatus according to claim 2, wherein every position-restricted pin has a guiding section and a restricting section.

4. The apparatus according to claim 1, wherein the baffle plate is dismountable.

5. The apparatus according to claim 1, wherein the gap is in a range of 0.1 mm-1 mm.

6. The apparatus according to claim 1, further comprising a heat insulation holder, the bake plate disposed in the heat insulation holder, the heat insulation holder defining at least one first gas passage, the at least one first gas passage communicating with the at least one gas passage of the bake plate.

7. The apparatus according to claim 6, wherein one end of the at least one first gas passage of the heat insulation holder communicates with the at least one gas passage of the bake plate and the other end of the at least one first gas passage of the heat insulation holder connects to the gas line which is wrapped by a thermal insulation material.

8. The apparatus according to claim 1, wherein the plurality of support components respectively pass through the bake plate, the plurality of support components are fixed on a support arm, the support arm connects to the driving device.

9. The apparatus according to claim 8, wherein every support component has an anti-slip pin and a support shaft, the anti-slip pin has a ball-shaped head for supporting the substrate, the anti-slip pin is mounted on a top end of the support shaft, a bottom end of the support shaft is fixed on the support arm.

10. The apparatus according to claim 1, wherein the baffle plate has a guide plane.

11. The apparatus according to claim 10, wherein the guide plane is tilted and has an angle with a vertical plane, the angle is less than 20 degrees.

12. The apparatus according to claim 1, wherein a material of the baffle plate is ceramic wrapped by thermal insulation or stainless steel wrapped by thermal insulation.

13. The apparatus according to claim 1, further comprising a lift cover disposed above the baffle plate for exhausting mixed gas.

14. The apparatus according to claim 13, wherein the lift cover has a hollow cavity, the lift cover defines an inlet port and an exhaust interface, the inlet port and the exhaust interface communicate with the hollow cavity and the exhaust interface connects to an exhaust system.

15. The apparatus according to claim 14, wherein the lift cover defines a drain port communicating with the hollow cavity.

16. The apparatus according to claim 1, further comprising a temperature sensor disposed in the bake plate.

17. The apparatus according to claim 1, wherein the heated gas is hot inert gas or hot nitrogen.

18. The apparatus according to claim 1, wherein a temperature of the heated gas is same as a temperature of the bake plate.

* * * * *